United States Patent
Gramuglia et al.

(10) Patent No.: US 12,324,252 B1
(45) Date of Patent: Jun. 3, 2025

(54) STRUCTURES INCLUDING A PHOTODETECTOR AND MULTIPLE CATHODE CONTACTS

(71) Applicant: GlobalFoundries Singapore Pte. Ltd., Singapore (SG)

(72) Inventors: Francesco Gramuglia, Augsburg (DE); Eng Huat Toh, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 0 days.

(21) Appl. No.: 18/649,247

(22) Filed: Apr. 29, 2024

(51) Int. Cl.
*H10F 30/225* (2025.01)
*H01L 23/528* (2006.01)
*H01L 23/532* (2006.01)
*H10F 71/00* (2025.01)

(52) U.S. Cl.
CPC ....... *H10F 30/225* (2025.01); *H01L 23/5283* (2013.01); *H01L 23/53271* (2013.01); *H10F 71/121* (2025.01)

(58) Field of Classification Search
CPC .......................... H01L 31/107; H01L 31/1804
See application file for complete search history.

(56) References Cited

U.S. PATENT DOCUMENTS

| 10,153,310 | B2 | 12/2018 | Zhang et al. | |
|---|---|---|---|---|
| 10,204,950 | B1 | 2/2019 | Yamashita | |
| 12,188,816 | B2* | 1/2025 | Zhu | H10F 77/14 |
| 12,191,330 | B2* | 1/2025 | Moussy | H10F 30/225 |
| 12,218,170 | B2* | 2/2025 | Ishida | H01L 23/481 |
| 2011/0210362 | A1* | 9/2011 | Lee | H01L 33/38 |
| | | | | 257/E33.072 |

(Continued)

FOREIGN PATENT DOCUMENTS

JP 2020102498 A 7/2020
JP 2020150001 A 9/2020

OTHER PUBLICATIONS

Hu Haifan et al.: "Advanced Back-Illuminated Silicon Photomultipliers With Surrounding P+ Trench", IEEE Sensors Journal, IEEE, USA, vol. 22, No. 16, Jul. 11, 2022 (Jul. 11, 2022), pp. 16089-16097, XP011917092, ISSN: 1530-437X, DOI: 10.1109/JSEN.2022.3188692.

(Continued)

*Primary Examiner* — Joseph C. Nicely
*Assistant Examiner* — E. Rhett Cheek
(74) *Attorney, Agent, or Firm* — Thompson Hine LLP; Anthony Canale

(57) ABSTRACT

Structures including a photodetector, such as a single-photon avalanche diode, and related methods. The structure comprises a semiconductor layer having a device region and a top surface, and a photodetector including a first well in the device region and a second well. The first well is disposed between the second well and the top surface. The structure further comprises a deep trench isolation region that extends from the top surface into the semiconductor layer. The deep trench isolation region surrounds a perimeter of the device region, and the deep trench isolation region comprises a dielectric material. The structure further comprises a contact including a conductor layer that extends from the top surface of the semiconductor layer to the second well. The contact has a first discrete position about the perimeter of the device region.

19 Claims, 13 Drawing Sheets

(56) References Cited

U.S. PATENT DOCUMENTS

| | | | |
|---|---|---|---|
| 2014/0061702 A1* | 3/2014 | Yamamoto | H01L 33/44 |
| | | | 257/98 |
| 2015/0228684 A1* | 8/2015 | Yamashita | H01L 27/14641 |
| | | | 257/292 |
| 2018/0019268 A1* | 1/2018 | Zhang | H01L 27/1464 |
| 2021/0159257 A1* | 5/2021 | Moussy | H01L 27/14603 |
| 2022/0020789 A1* | 1/2022 | Otake | H01L 27/14623 |
| 2022/0115552 A1* | 4/2022 | Lim | H01L 31/18 |
| 2022/0165902 A1* | 5/2022 | Okazaki | H01L 27/146 |
| 2022/0254946 A1* | 8/2022 | Park | H01L 31/111 |
| 2022/0392944 A1* | 12/2022 | Tochigi | H01L 31/1075 |
| 2023/0097091 A1 | 3/2023 | Morimoto et al. | |
| 2024/0145298 A1* | 5/2024 | Huang | H01L 21/76229 |
| 2024/0355855 A1* | 10/2024 | Cheng | H01L 27/14603 |
| 2024/0387765 A1* | 11/2024 | Masini | H01L 31/028 |

OTHER PUBLICATIONS

European Patent Office; Extended European Search Report and Opinion issued in European Patent Application No. 24204086.3 on Apr. 1, 2025; 13 pages.

* cited by examiner

STRUCTURES INCLUDING A PHOTODETECTOR AND MULTIPLE CATHODE CONTACTS

BACKGROUND

The present disclosure relates to semiconductor device fabrication and integrated circuits and, more specifically, to structures including a photodetector, such as a single-photon avalanche diode, and related methods.

A single-photon avalanche diode (SPAD) is a type of solid-state photodetector belonging to the same device family as photodiodes and avalanche photodiodes. A fundamental difference between single-photon avalanche diodes and other types of photodetectors is that a single-photon avalanche diode is biased well above its reverse-bias breakdown voltage. When a single-photon avalanche diode is placed under such a high reverse bias, photon-initiated charge carriers generated by photoelectric conversion are accelerated by the electric field to a kinetic energy that is high enough to knock electrons out of atoms of the bulk material and generate additional charge carriers that may exponentially grow to generate an avalanche of charge carriers. A single-photon avalanche diode can detect single photons providing short duration current pulses that may be counted or used to obtain a time of arrival of a particular incident single photon.

Processes for fabricating a single-photon avalanche diode are subject to certain limitations. For example, conventional structures for a single-photon avalanche diode require a peripheral cathode contact and a guard ring that both surround the entirety of the active device region. The guard ring electrically isolates the peripheral cathode contact from the active region, and the peripheral cathode contact is coupled to a buried cathode. A deep trench isolation region surrounds the peripheral contact and guard ring to provide electrical isolation. A limitation is that the guard ring and the peripheral contact do not scale when shrinking the device size.

Improved structures including a photodetector, such as a single-photon avalanche diode, and related methods are needed.

SUMMARY

In an embodiment of the invention, a structure comprises a semiconductor layer having a device region and a top surface, and a photodetector including a first well in the device region and a second well. The first well is disposed between the second well and the top surface. The structure further comprises a deep trench isolation region that extends from the top surface into the semiconductor layer. The deep trench isolation region surrounds a perimeter of the device region, and the deep trench isolation region comprises a dielectric material. The structure further comprises a contact including a conductor layer that extends from the top surface of the semiconductor layer to the second well. The conductor layer has a discrete position about the perimeter of the device region.

In an embodiment of the invention, a method comprises forming a photodetector that includes a first well in a device region of a semiconductor layer and a second well. The first well is disposed between the second well and a top surface of the semiconductor layer. The method further comprises forming a deep trench isolation region that extends from the top surface into the semiconductor layer. The deep trench isolation region surrounds a perimeter of the device region, and the deep trench isolation region comprises a dielectric material. The method further comprises forming a contact including a conductor layer that extends from the top surface of the semiconductor layer to the second well. The conductor layer has a discrete position about the perimeter of the device region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
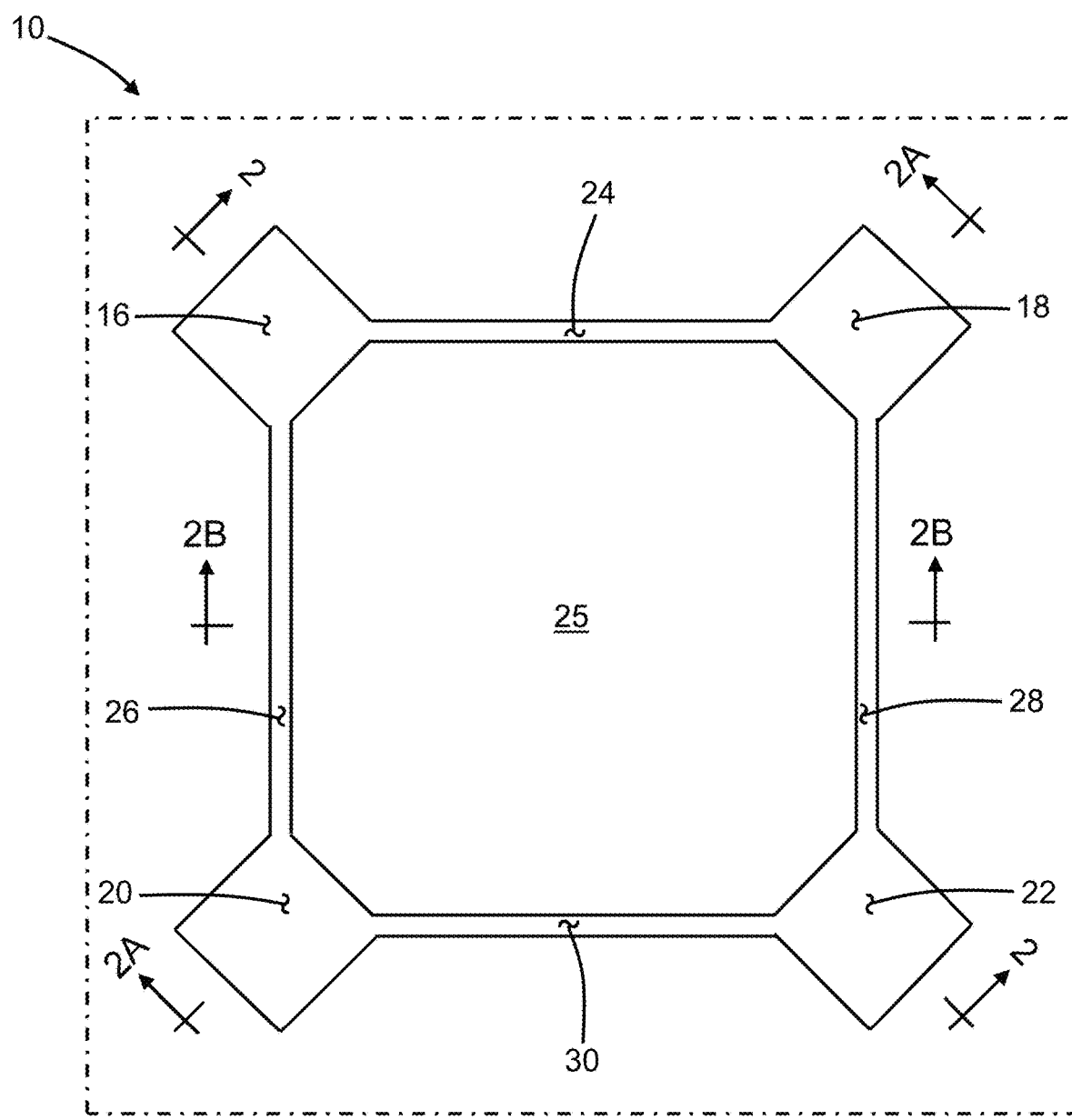
FIG. 1 is a top view of a structure at an initial fabrication stage of a processing method in accordance with embodiments of the invention.
Figure 2:
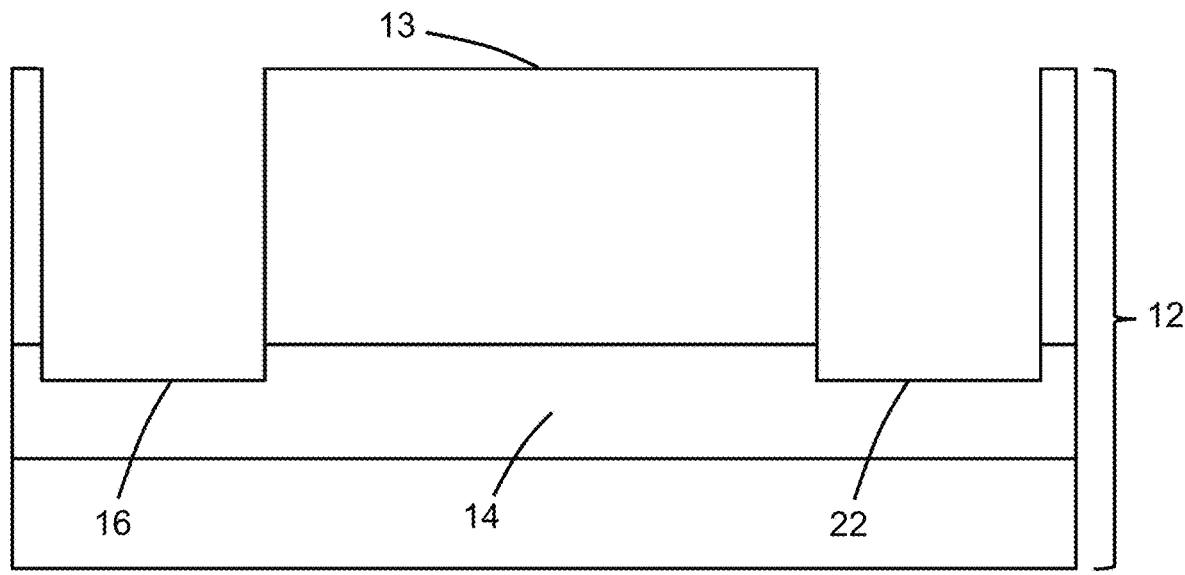
FIG. 2 is a cross-sectional view taken generally along line 2-2 in FIG. 1.
Figure 2A:
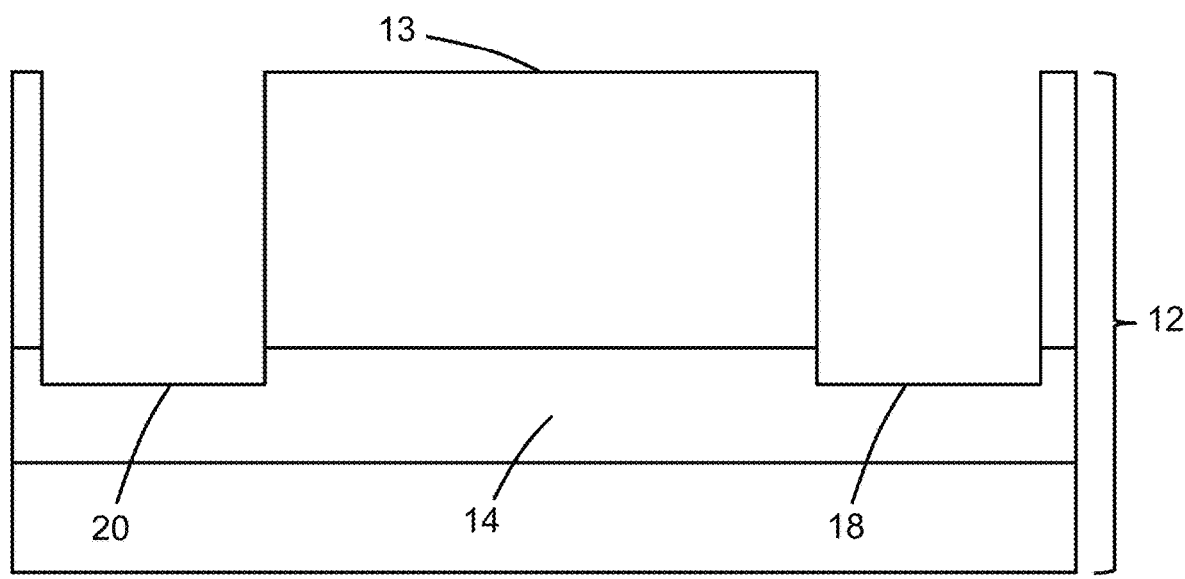
FIG. 2A is a cross-sectional view taken generally along line 2A-2A in FIG. 1.
Figure 2B:
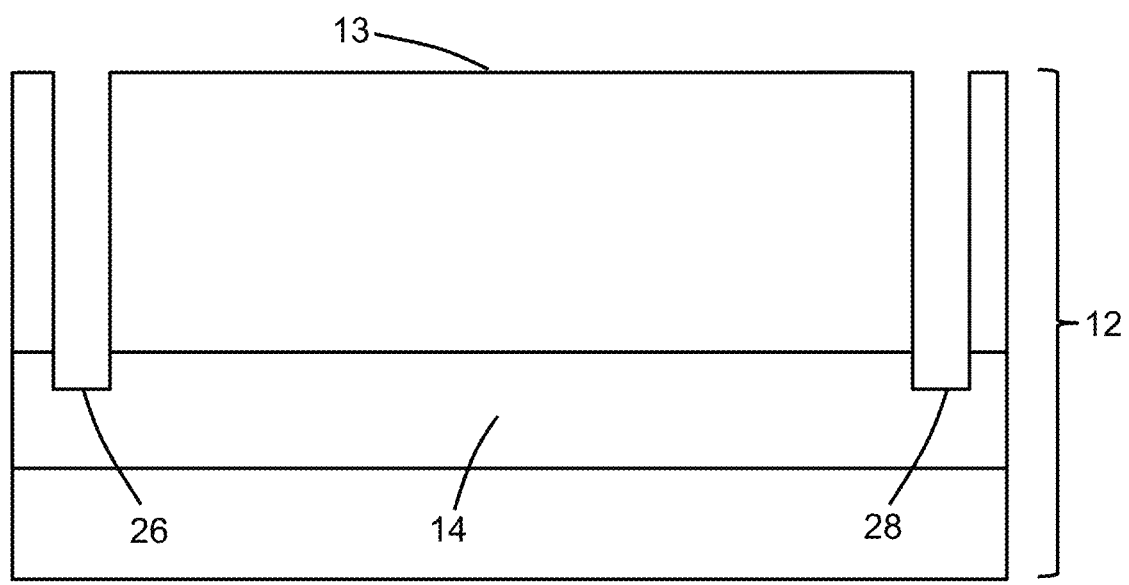
FIG. 2B is a cross-sectional view taken generally along line 2B-2B in FIG. 1.
Figure 3:
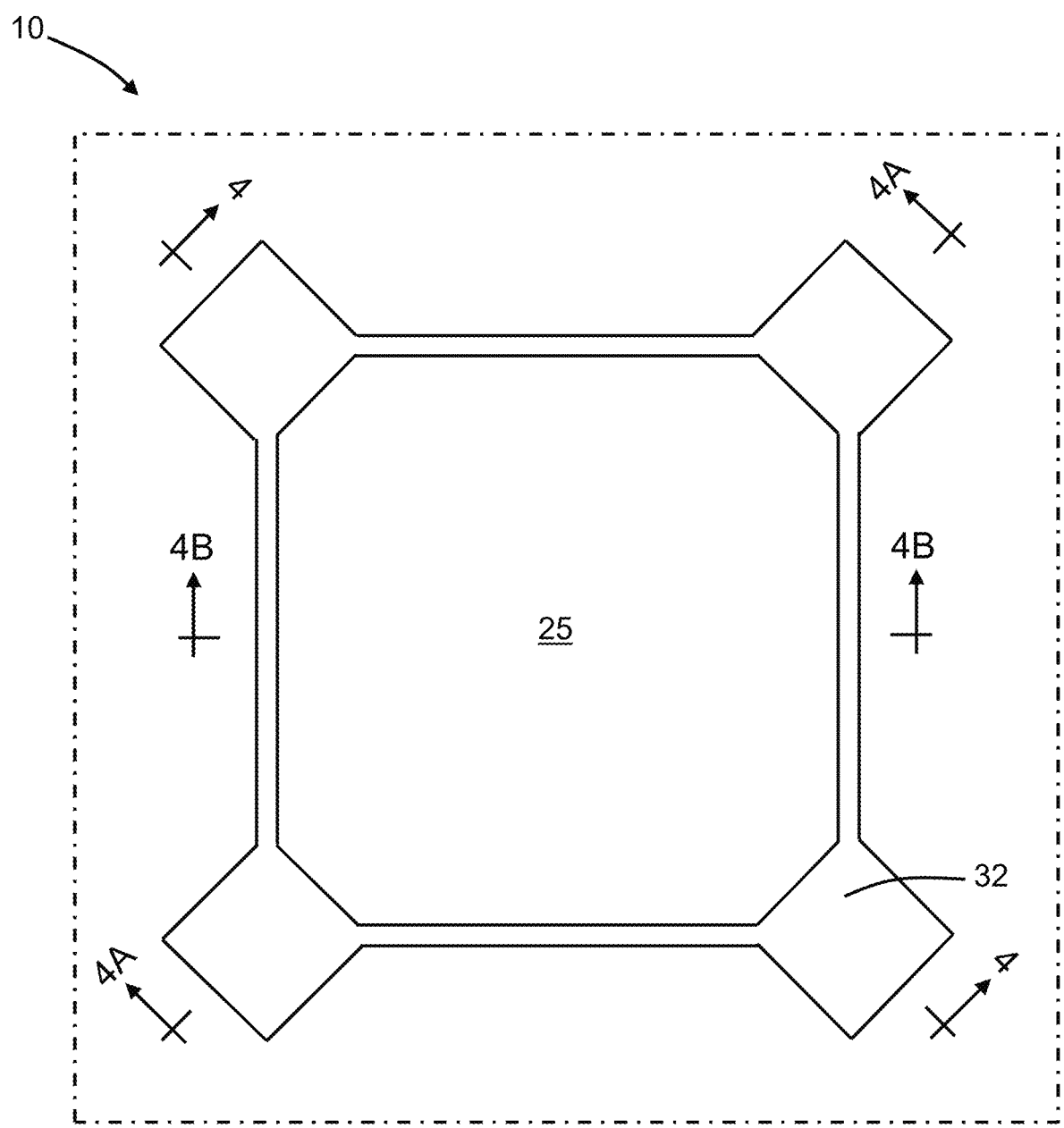
FIG. 3 is a top view of the structure the structure at a fabrication stage subsequent to FIG. 1.
Figure 4:
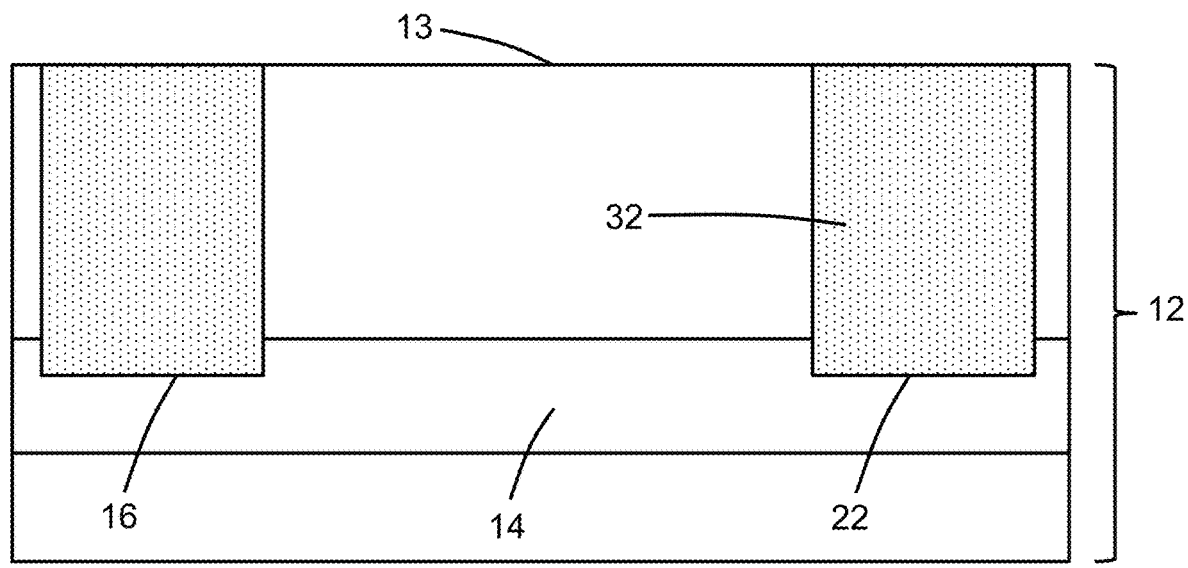
FIG. 4 is a cross-sectional view taken generally along line 4-4 in FIG. 3.
Figure 4A:
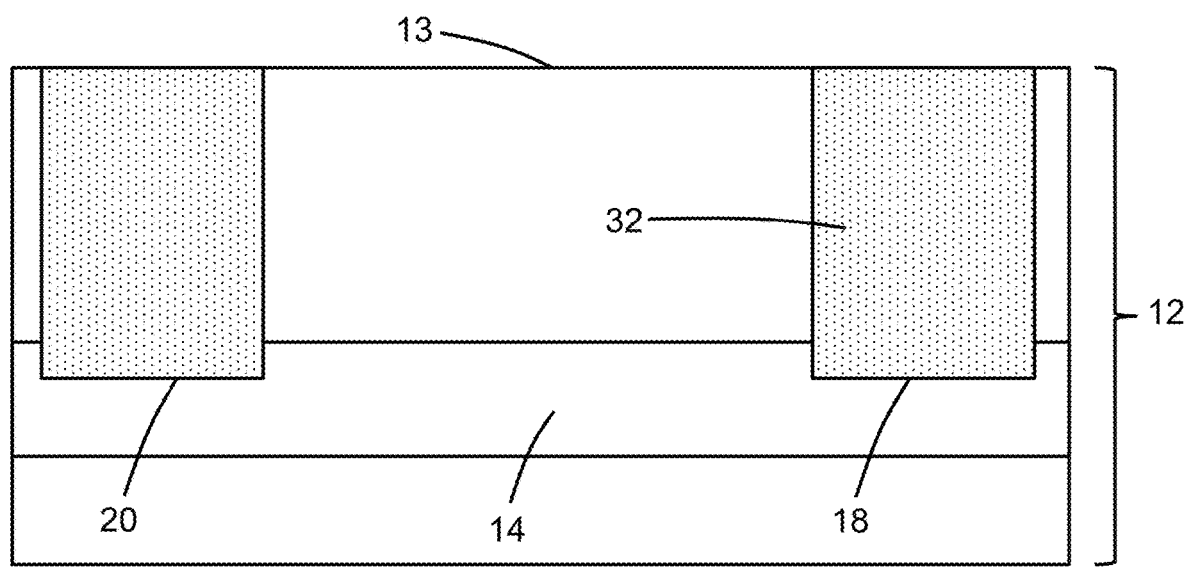
FIG. 4A is a cross-sectional view taken generally along line 4A-4A in FIG. 3.
Figure 4B:
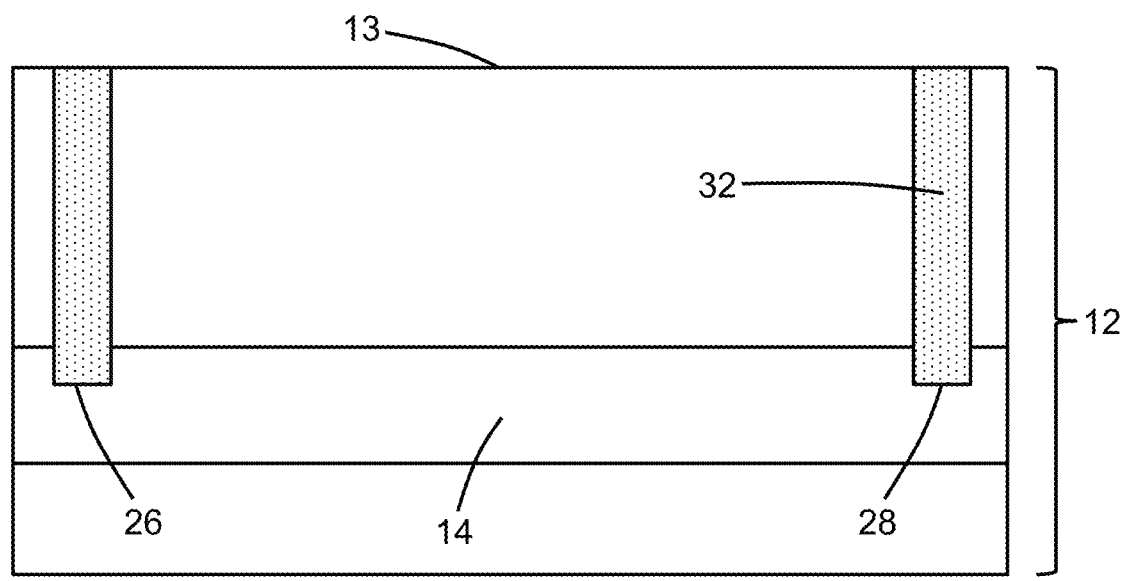
FIG. 4B is a cross-sectional view taken generally along line 4B-4B in FIG. 13.
Figure 5:
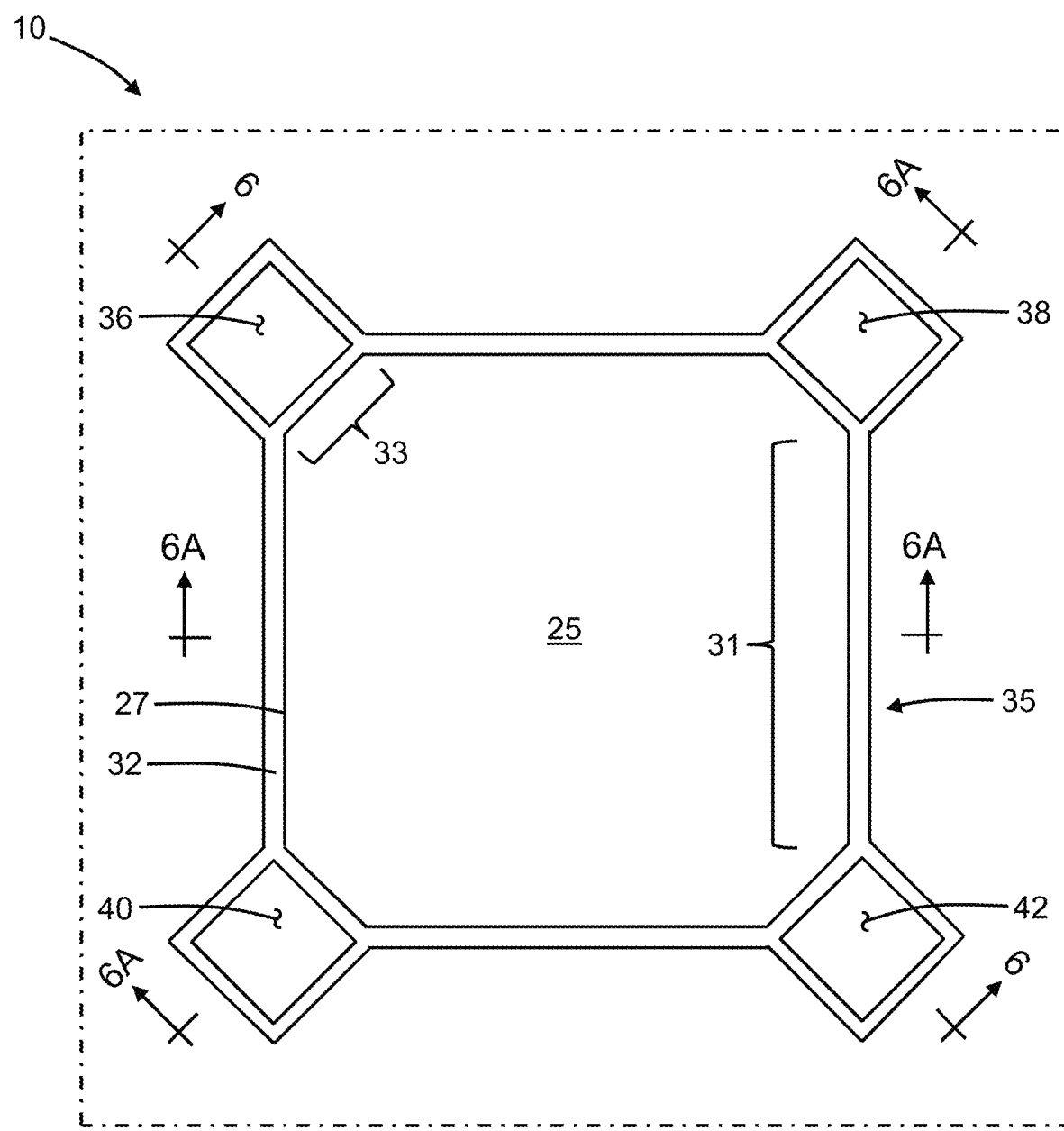
FIG. 5 is a top view of the structure the structure at a fabrication stage subsequent to FIG. 3.
Figure 6:
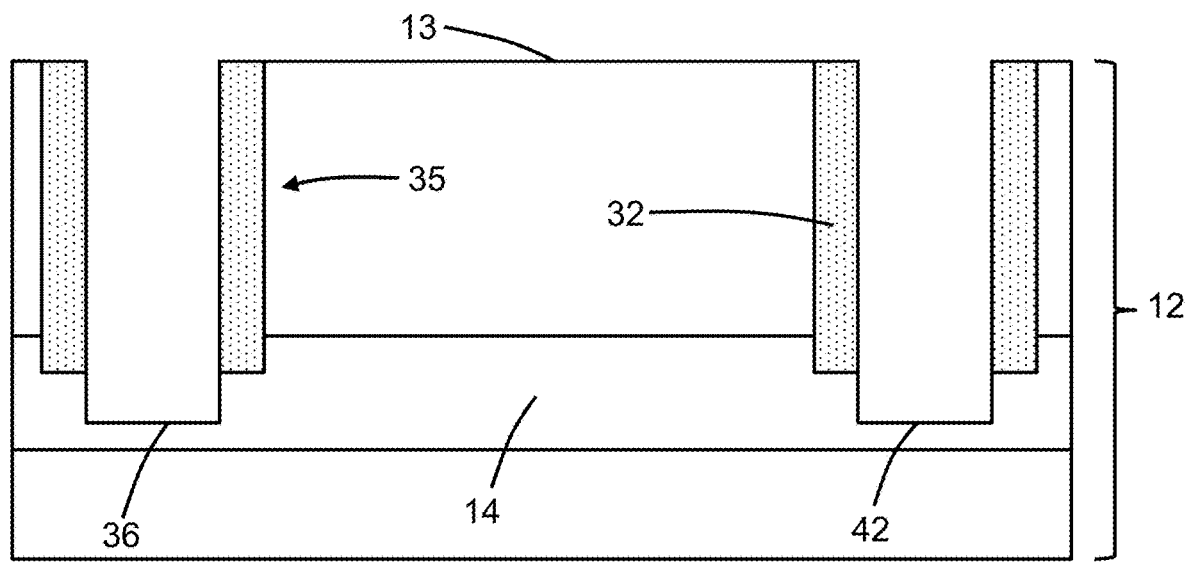
FIG. 6 is a cross-sectional view taken generally along line 6-6 in FIG. 5.
Figure 6A:
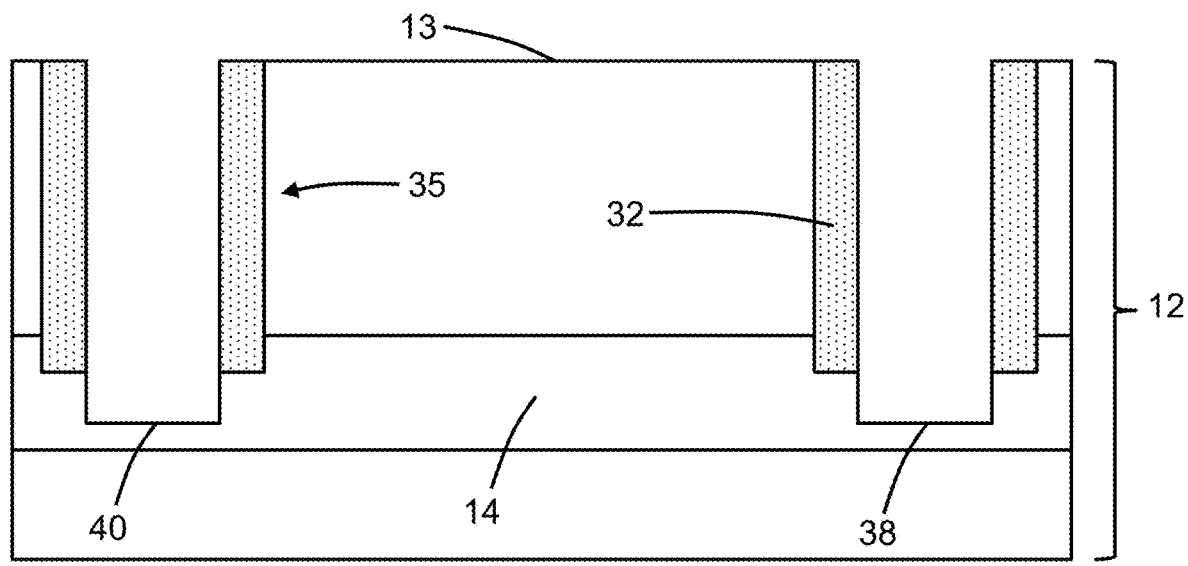
FIG. 6A is a cross-sectional view taken generally along line 6A-6A in FIG. 5.
Figure 6B:
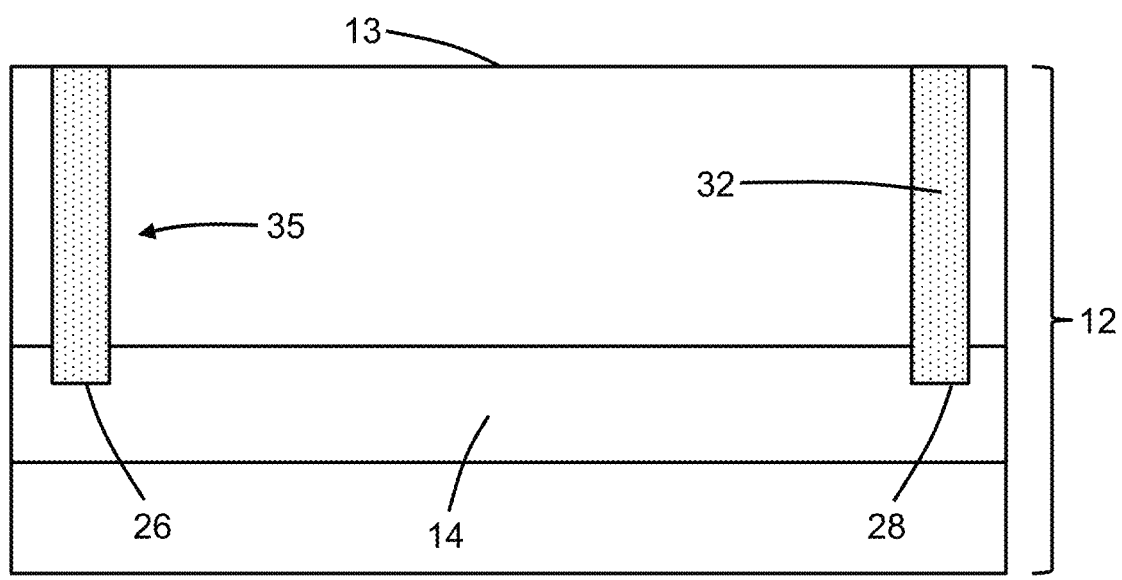
FIG. 6B is a cross-sectional view taken generally along line 6B-6B in FIG. 5.

With reference to FIGS. 1, 2, 2A, 2B and in accordance with embodiments of the invention, a structure 10 for a photodetector in the representative form of a single-photon avalanche diode includes a semiconductor layer 12 and a well 14 formed in the semiconductor layer 12. The semiconductor layer 12 may be comprised of a semiconductor material, such as single-crystal silicon. In an embodiment, the semiconductor layer 12 may be comprised of single-crystal silicon. In an embodiment, the semiconductor layer 12 may be a bulk semiconductor substrate. In an embodiment, the semiconductor layer 12 may be an epitaxial layer grown on a bulk semiconductor substrate.

The well 14 is spaced in a vertical direction from a top surface 13 of the semiconductor layer 12. The well 14 is therefore buried beneath the top surface 13 with an unimplanted portion of the semiconductor layer 12 disposed between the well 14 and the top surface 13. The well 14 may be formed by, for example, an ion implantation process using an implantation mask with an opening that determines the portion of the semiconductor layer 12 targeted to be implanted with ions. The implantation mask may include a layer of photoresist applied by a spin-coating process, pre-baked, exposed to light projected through a photomask, baked after exposure, and developed with a chemical developer to form the opening. The implantation conditions, such as ion species, dose, and kinetic energy, may be selected to tune the electrical and physical characteristics of the well 14. The implantation mask, which has a thickness and stopping power adequate to stop the ions, may be stripped after forming the well 14. In an embodiment, the semiconductor material of the well 14 may receive and contain an n-type dopant, such as arsenic or phosphorus, that provides n-type conductivity.

Trenches 16, 18, 20, 22 and trenches 24, 26, 28, 30 are formed as respective openings that penetrate from the top surface 13 through the portion of the semiconductor layer 12 between the well 14 and the top surface 13 to the well 14. The trench 24 may connect the trench 16 to the trench 18, the trench 26 may connect the trench 18 to the trench 20, the trench 28 may connect the trench 20 to the trench 22, and the trench 30 may connect the trench 22 to the trench 16. The trenches 16, 18, 20, 22 may have a rectangular cross-sectional area, and the trenches 24, 26, 28, 30 may have elongated rectangular cross-sectional areas with respective lengths that are greater their respective widths. The trenches 16, 18, 20, 22 and the trenches 24, 26, 28, 30 fully surround a device region 25 of the semiconductor layer 12, and the trenches 16, 18, 20, 22 may be positioned adjacent to the corners of the device region 25. In an embodiment, one of the trenches 16, 18, 20, 22 may be positioned adjacent to each corner of the device region 25. In an embodiment, the device region 25 may have an octagonal cross-sectional profile with corners that are chamfered, and each of the trenches 16, 18, 20, 22 may be positioned adjacent to one of the corners of the device region 25.

The trenches 16, 18, 20, 22 and the trenches 24, 26, 28, 30 may be formed by patterning the semiconductor layer 12 with lithography and etching processes. To that end, an etch mask may be formed by a lithography process over the semiconductor layer 12. The etch mask may include a layer of a photoresist applied by a spin-coating process, pre-baked, exposed to light projected through a photomask, baked after exposure, and developed with a chemical developer to define openings at the intended locations for the trenches 16, 18, 20, 22 and the trenches 24, 26, 28, 30. An etching process is used to form the trenches 16, 18, 20, 22 and the trenches 24, 26, 28, 30 in the semiconductor layer 12 at the locations of the openings in the etch mask. The etch mask may be stripped after forming the trenches 16, 18, 20, 22 and the trenches 24, 26, 28, 30.

With reference to FIGS. 3, 4, 4A, 4B in which like reference numerals refer to like features in FIGS. 1, 2, 2A, 2B and at a subsequent fabrication stage of the processing method, a dielectric layer 32 is formed that includes respective portions that are disposed inside the trenches 16, 18, 20, 22 and respective portions that are disposed inside the trenches 24, 26, 28, 30. The dielectric layer 32 may be comprised of a dielectric material, such as silicon dioxide, and may be deposited and planarized with chemical-mechanical polishing. In an embodiment, the dielectric material of the dielectric layer 32 may fully fill the trenches 16, 18, 20, 22 and the trenches 24, 26, 28, 30.

With reference to FIGS. 5, 6, 6A, 6B in which like reference numerals refer to like features in FIGS. 3, 4, 4A, 4B and at a subsequent fabrication stage of the processing method, trenches 36, 38, 40, 42 may be respectively formed in the different portions of the dielectric layer 32 inside the trenches 16, 18, 20, 22 as openings that penetrate fully through the dielectric material and into the doped semiconductor material of the well 14. The trenches 36, 38, 40, 42 may be patterned by lithography and etching processes. To that end, an etch mask may be formed by a lithography process that includes a layer of a photoresist applied by a spin-coating process, pre-baked, exposed to light projected through a photomask, baked after exposure, and developed with a chemical developer to define openings at the intended locations for the trenches 36, 38, 40, 42. An etching process is used to form the trenches 36, 38, 40, 42 at the locations of the openings in the etch mask. The portions of the dielectric layer 32 inside the trenches 24, 26, 28, 30 and the semiconductor layer 12 are masked by the etch mask and preserved during the etching process. The etch mask may be stripped after forming the trenches 36, 38, 40, 42.

The trenches 36, 38, 40, 42 have a cross-sectional area that is smaller than the cross-sectional area of the trenches 16, 18, 20, 22. The trenches 36, 38, 40, 42 are positioned inside the outer boundary of the trenches 16, 18, 20, 22 such that the trenches 36, 38, 40, 42 are laterally surrounded by the dielectric material of the dielectric layer 32.

The device region 25 of the semiconductor layer 12 has a perimeter 27 that is surrounded by a deep trench isolation region 35. The deep trench isolation region 35 includes sections 31 of the dielectric layer 32 that are disposed inside the trenches 24, 26, 28, 30 and chamfered sections 33 of the dielectric layer 32 that are formed inside the trenches 16, 18, 20, 22 by the formation of the trenches 36, 38, 40, 42. The sections 31 of the dielectric layer 32 alternate with the chamfered sections 33 of the dielectric layer 32 about the perimeter 27 of the device region 25 to define a closed shape in which the constituent dielectric material is continuous around the perimeter 27. The chamfered sections 33 are disposed between the trenches 36, 38, 40, 42 and the perimeter 27 of the device region 25, and the chamfered sections 33 may [are] be disposed at corners of the device region 25. In an embodiment, the chamfered sections 33 may be symmetrically arranged about the perimeter 27. The chamfered sections 33, which may be shorter than the sections 31, are angled relative to the sections 31. In an embodiment, the perimeter 27 of the device region 25 may define an octagonally-shaped boundary, and the deep trench isolation region 35 may have a closed shape that is octagonal with four sections 31 and four sections 33 that are arranged to fully surround the octagonally-shaped boundary.

The well 14 has an upper portion that is surrounded by the deep trench isolation region 35 and a lower portion that is disposed beneath the deep trench isolation region 35. The deep trench isolation region 35 is disposed between the lower portion of the well 14 and the top surface 13. The upper portion of the well 14 is disposed between the lower portion of the well 14 and the top surface 13. The lower portion of the well 14 extends continuously beneath the device region 25 and the deep trench isolation region 35.

With reference to FIGS. 7, 8, 8A, 8B in which like reference numerals refer to like features in FIGS. 5, 6, 6A, 6B and at a subsequent fabrication stage of the processing method, a conductor layer 46 is formed inside the trench 36 as a solid pillar that is arranged interior of, and surrounded by, the portion of the patterned dielectric layer 32 inside the trench 16. A conductor layer 48 is formed inside the trench 38 as a solid pillar that is arranged interior of, and surrounded by, the patterned portion of the dielectric layer 32 inside the trench 18. A conductor layer 50 is formed inside the trench 40 as a solid pillar that is arranged interior of, and surrounded by, the patterned portion of the dielectric layer 32 inside the trench 20. A conductor layer 52 is formed inside the trench 42 as a solid pillar that is arranged interior of, and surrounded by, the patterned portion of the dielectric layer 32 inside the trench 22.

The conductor layer 46 has an end portion 47 that projects in depth beyond the sections 31, 33 of the deep trench isolation region 35 and into the well 14. The conductor layer 48 has an end portion 49 that projects in depth beyond the sections 31, 33 of the deep trench isolation region 35 and into the well 14. The conductor layer 50 has an end portion 51 that projects in depth beyond the sections 31, 33 of the deep trench isolation region 35 and into the well 14. The conductor layer 52 has an end portion 53 that projects in depth beyond the sections 31, 33 of the deep trench isolation region 35 and into the well 14. The conductor layers 46, 48, 50, 52 also have upper portions that are arranged between the end portions 47, 49, 51, 53 and the top surface 13.

The conductor layers 46, 48, 50, 52 are defined as pillars of conductive material that extend from the top surface 13 to a depth D in the semiconductor layer 12. The chamfered sections 33 (FIG. 5) of the dielectric layer 32 are laterally disposed between the device region 25 of the semiconductor layer 12 and the upper portions of the conductor layers 46, 48, 50, 52. In an embodiment, the end portions 47, 49, 51, 53 of the conductor layers 46, 48, 50, 52 may terminate within the well 14. The depth D of the end portions 47, 49, 51, 53 of the conductor layers 46, 48, 50, 52, which may be measured relative to the top surface 13, is greater than the depth of the sections 31, 33 of the deep trench isolation region 35 relative to the top surface 13. The conductor layers 46, 48, 50, 52 are electrically and physically coupled by the end portions 47, 49, 51, 53 to the well 14 and are accessible at the top surface 13 for establishing an electrical connection.

Each of the conductor layers 46, 48, 50, 52 is coupled as an independent contact to the well 14 to provide multiple electrical and physical connections to the well 14. The conductor layers 46, 48, 50, 52 are comprised of a conductive material that is deposited inside the trenches 36, 38, 40, 42 and planarized by chemical-mechanical polishing so that the upper portions of the conductor layers 46, 48, 50, 52 are coplanar with the top surface 13. In an embodiment, the conductive material may be comprised of doped polysilicon. In an alternative embodiment, the conductive material may be comprised of a metal, such as tungsten.

The structure 10 includes a well 54 and a doped region 56 within the well 54. the well 54 is positioned in a vertical direction between the well 14 and the top surface 13 of the semiconductor layer 12. The well 54 and the doped region 56 are doped to have the same conductivity type, and the well 54 and the doped region 56 are doped to have an opposite conductivity type from the well 14. The well 54 adjoins the well 14 along a p-n junction that, during operation of the single-photon avalanche diode, may be reversed biased.

The well 54 may be formed by, for example, an ion implantation process using an implantation mask with an opening that determines the portion of the semiconductor layer 12 targeted to be implanted with ions. The implantation mask may include a layer of photoresist applied by a spin-coating process, pre-baked, exposed to light projected through a photomask, baked after exposure, and developed with a chemical developer to form the opening. The implantation conditions, such as ion species, dose, and kinetic energy, may be selected to tune the electrical and physical characteristics of the well 54. The implantation mask, which has a thickness and stopping power adequate to stop the ions, may be stripped after forming the well 54. In an embodiment, the semiconductor material of the well 54 may receive and contain a p-type dopant, such as boron, that provides p-type conductivity. The well 54 may provide an anode of the single-photon avalanche diode.

The doped region 56 may be formed in a central portion of the semiconductor layer 12. The doped region 56 may be formed by, for example, an ion implantation process using an implantation mask with an opening that determines the portion of the semiconductor layer 12 targeted to be implanted with ions. The implantation mask may include a layer of photoresist applied by a spin-coating process, pre-baked, exposed to light projected through a photomask, baked after exposure, and developed with a chemical developer to form the opening. The implantation conditions, such as ion species, dose, and kinetic energy, may be selected to tune the electrical and physical characteristics of the doped region 56. The implantation mask, which has a thickness and stopping power adequate to stop the ions, may be stripped after forming the doped region 56. In an embodiment, the semiconductor material of the doped region 56 may receive and contain a p-type dopant, such as boron, that provides p-type conductivity. The doped region 56 may be more heavily doped than the well 54 and may be used to establish an electrical connection to the well 54.

The deep trench isolation region 35 includes an upper portion that surrounds the device region 25 of the semiconductor layer 12, as well as surrounds the well 54 and the doped region 56 in the device region 25 of the semiconductor layer 12. The deep trench isolation region 35 includes a lower portion that extends partially through the well 14 such that only an upper portion of the well 14 is surrounded.

The perimeter 27 of the device region 25 may include multiple corners that coincide in position with the conductor layers 46, 48, 50, 52. In an embodiment, the octagonal shapes of the device region 25 and deep trench isolation region 35 may promote placement of the conductor layers 46, 48, 50, 52 of the contacts at respective discrete positions adjacent to the different corners. One of the chamfered sections 33 of the deep trench isolation region 35 is disposed at the perimeter 27 of the device region 25 between each of the conductor layers 46, 48, 50, 52 and the device region 25, and the sections 31 of the deep trench isolation region 35 extend between the chamfered sections 33.

The discrete positions for the conductor layers 46, 48, 50, 52 are distributed about the perimeter 27 of the device region 25 and, therefore, are distributed about the perimeter of the well 54 in the device region 25. As used herein, the conductor layers 46, 48, 50, 52 placed in the discrete positions are unconnected and distinct from each other such that the constituent conductive material is noncontinuous. The conductor layers 46, 48, 50, 52 do not surround the perimeter 27 of the device region 25 and, therefore, do not surround the perimeter of the well 54 coextensive with the perimeter 27 of the device region 25.

In an alternative embodiment, the conductivity types of the well 14, the well 54, and the doped region 56 may be swapped such that the well 14 has p-type conductivity, the well 54 has n-type conductivity, and the doped region 56 has n-type conductivity.

In use, the p-n junction between the well 14 and the well 54 is reverse-biased above the breakdown voltage. The structure 10 may be illuminated by light, which enters the device region 25. Incident photons are absorbed in the portion of the semiconductor layer 12 interior of the deep trench isolation region 35. When an incident photon is absorbed, an electron-hole pair is created, and an avalanche current is generated under the reverse bias by the creation of additional electron-hole pairs through impact ionization with atoms of the semiconductor material. The current continues to flow until the avalanche is quenched by lowering the bias to less than or equal to the breakdown voltage. The collected avalanche current provides a detectable electronic signal. In order to be able to recover for detecting another photon, the reverse bias is raised again above breakdown voltage.

The deep trench isolation region 35 may electrically and optically isolate the device region 25 of the single-photon avalanche diode from the adjacent device regions of other instances of the single-photon avalanche diode in a pixel array. As a result, the deep trench isolation region 35 may reduce or prevent optical crosstalk and electrical crosstalk between adjacent single-photon avalanche diodes in the pixel array. In contrast to conventional structures for a single-photon avalanche diode, the deep trench isolation region 35 does not penetrate fully through a doped well providing the cathode.

The structure 10 lacks a peripheral cathode contact surrounding the active area and lacks a guard ring needed to provide electrical isolation for the peripheral cathode contact, in contrast to conventional structures for a single-photon avalanche diode, because the conductor layers 46, 48, 50, 52 are used to contact the well 14 providing the cathode of the single-photon avalanche diode and are disposed outside of the deep trench isolation region 35. The elimination of the guard ring and peripheral contact eliminates obstacles to shrinking the device size, which may permit an increase in the fill factor when fabricating an array of single-photon avalanche diodes based on the structure 10. The device region 25 of the structure 10 may alternatively be sized larger than the active area of a conventional single-photon avalanche diode due to the elimination of the guard ring and peripheral cathode contact.

Figure 9:
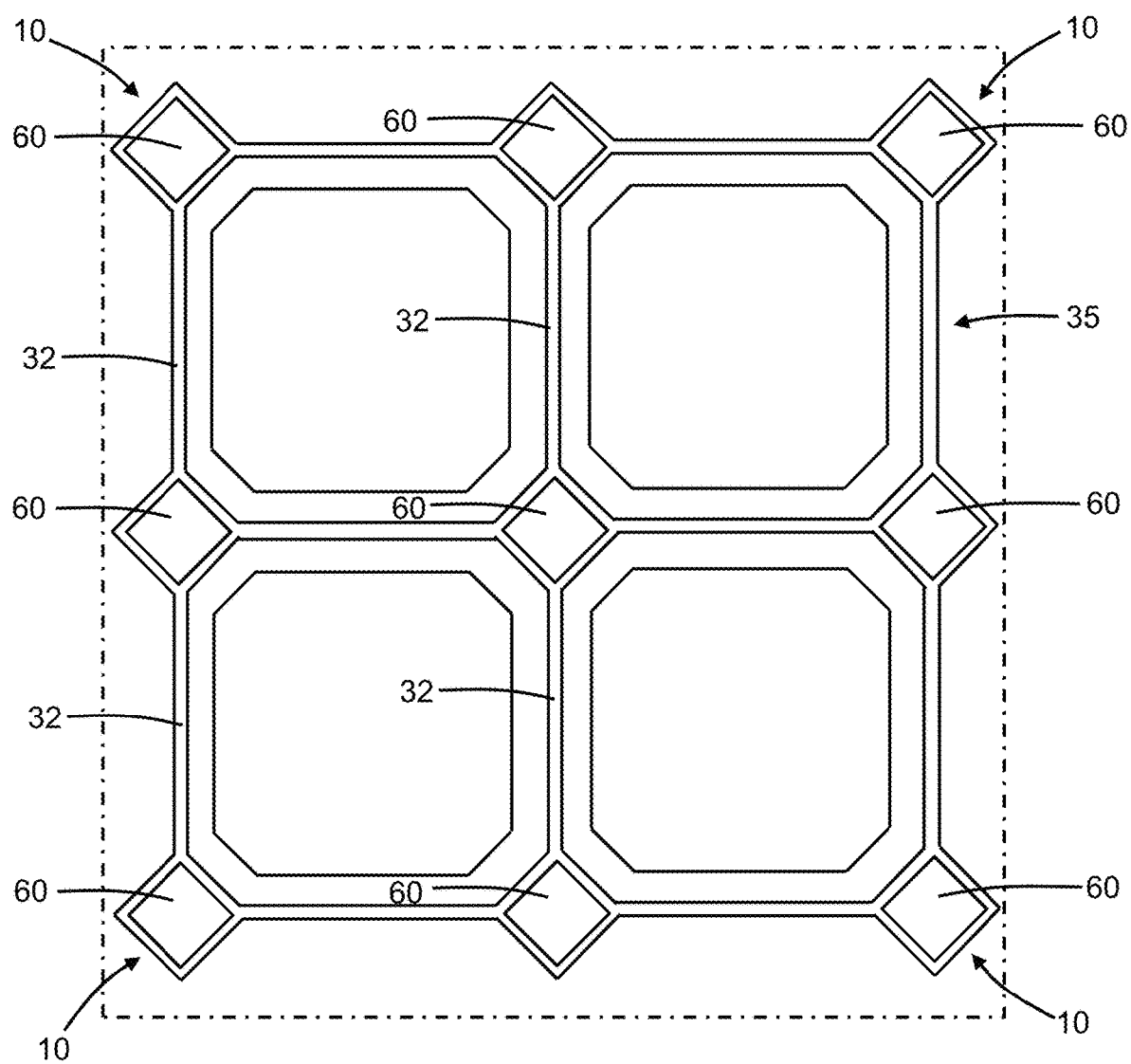
FIG. 9 is a top view of a structure for a pixel array in accordance with embodiments of the invention.

With reference to FIG. 9 and in accordance with embodiments of the invention, multiple instances of the single-photon avalanche diode embodied in the structure 10 may be arranged as pixels in a pixel array to define an image sensor, which may be used in a mobile phone, a digital camera, or another type of electronic device. The structure 10 may be connected by electrical connections to logic circuitry and to one or more power supplies.

Figure 7:
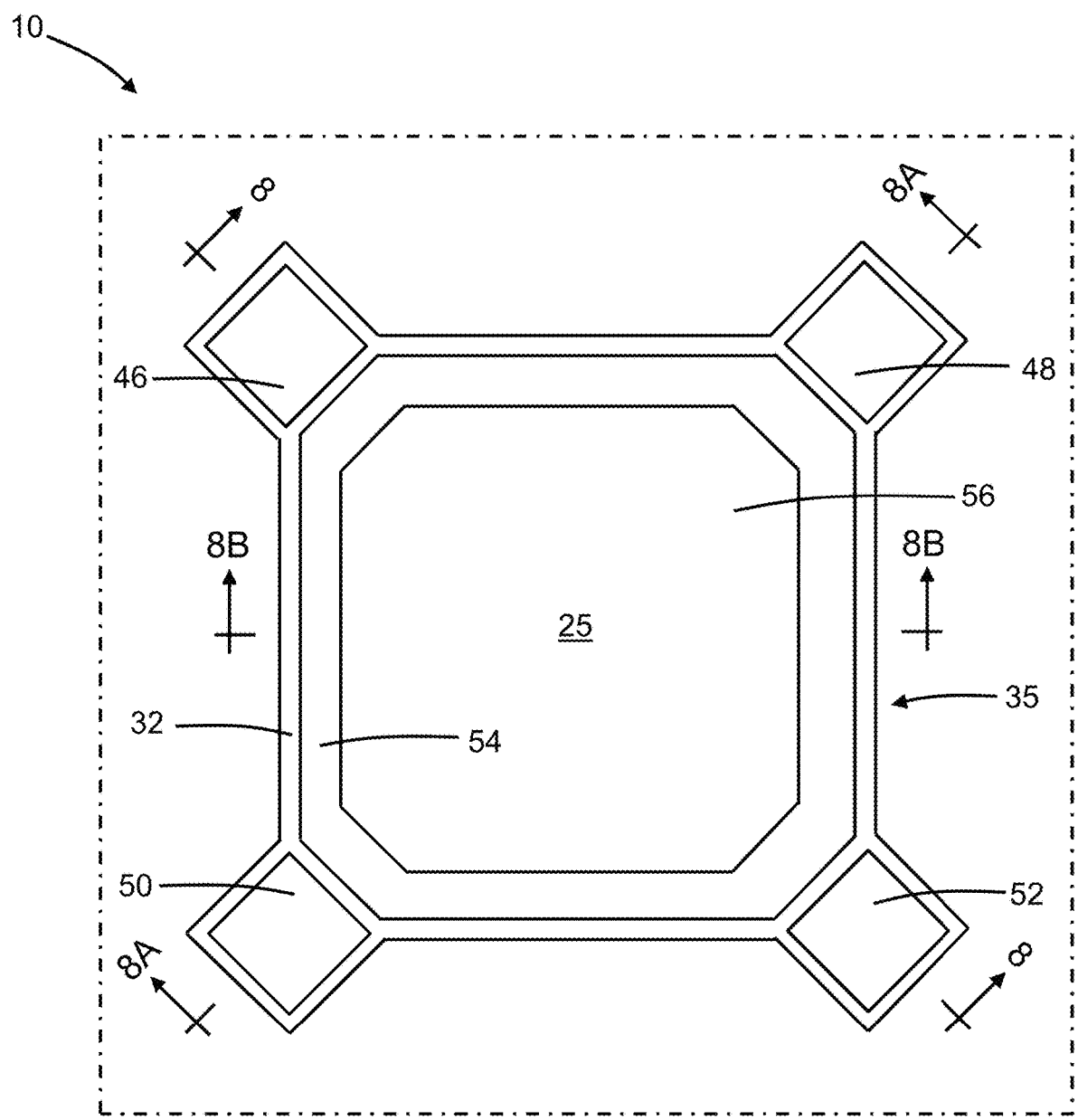
FIG. 7 is a top view of the structure the structure at a fabrication stage subsequent to FIG. 5.
Figure 8:
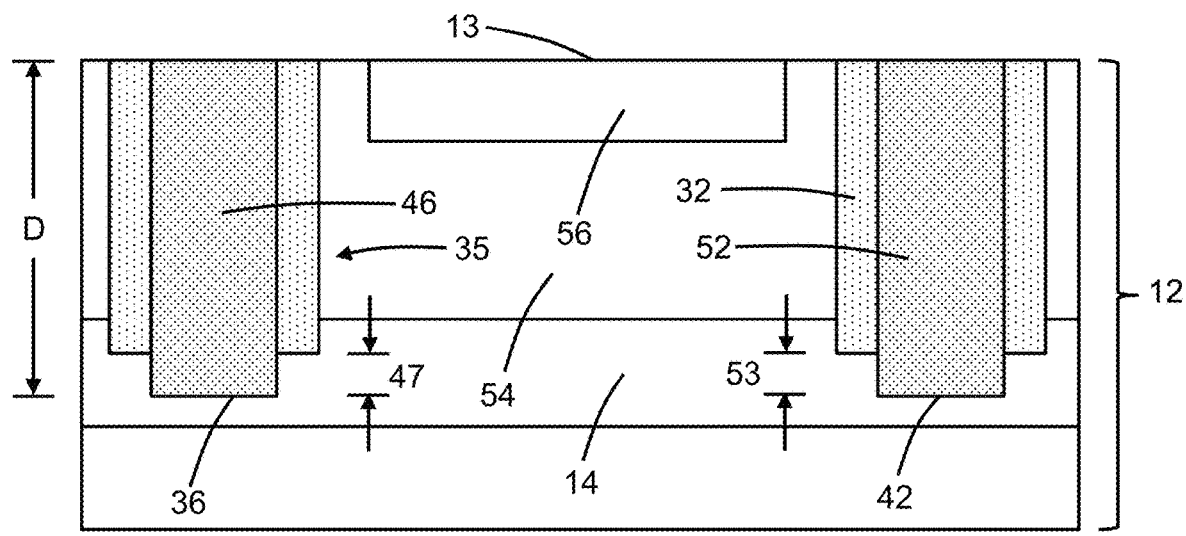
FIG. 8 is a cross-sectional view taken generally along line 8-8 in FIG. 7.
Figure 8A:
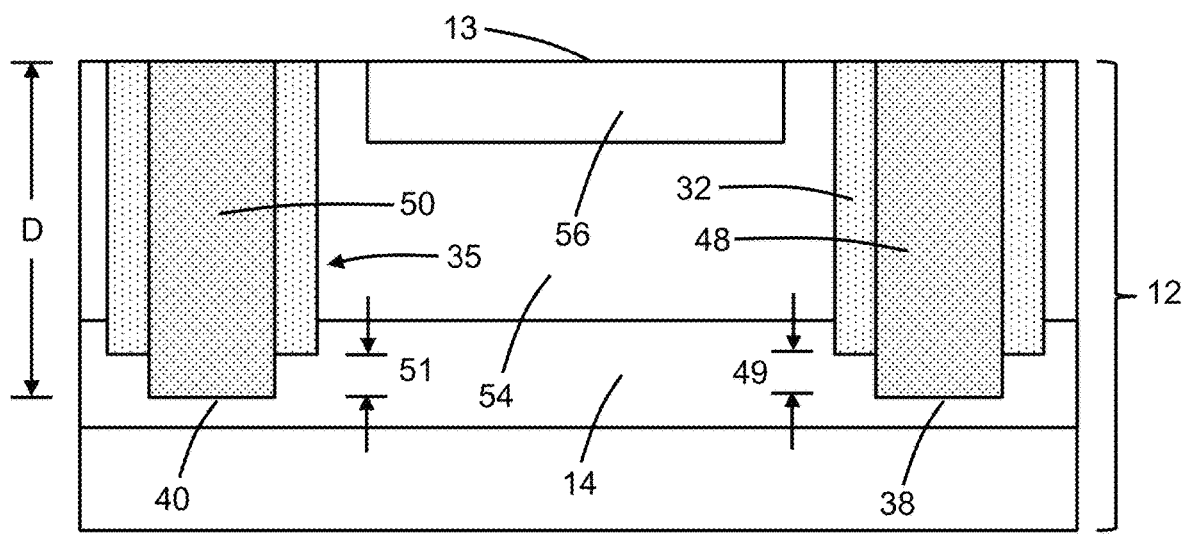
FIG. 8A is a cross-sectional view taken generally along line 8A-8A in FIG. 7.
Figure 8B:
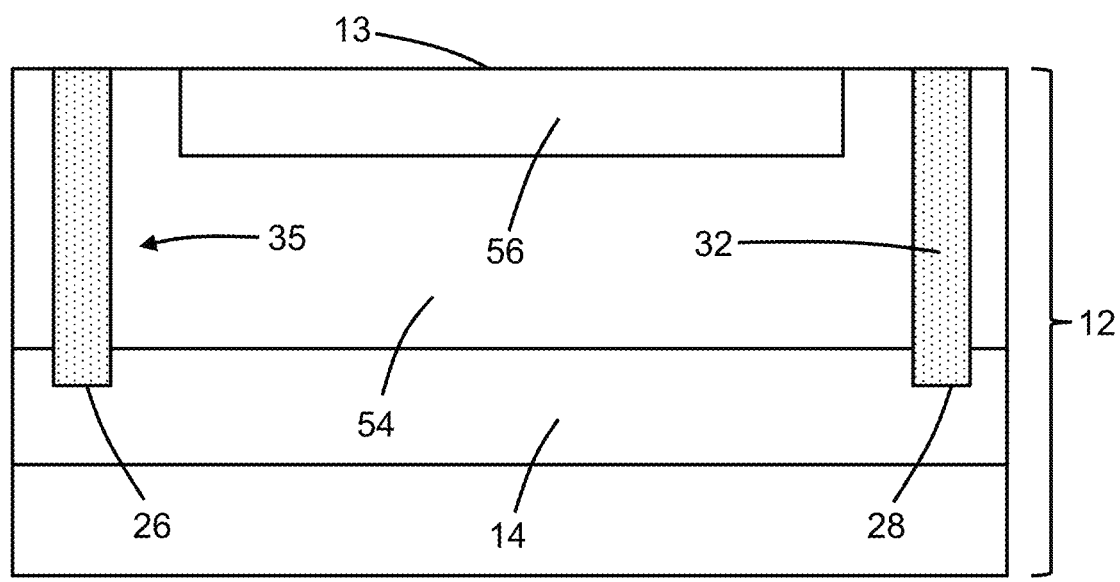
FIG. 8B is a cross-sectional view taken generally along line 8B-8B in FIG. 7.

In an embodiment, multiple instances of the single-photon avalanche diode embodied in the structure 10 may be arranged in the rows and columns of a pixel array. The instances of the single-photon avalanche diode include conductor layers 60, which may be identical to the conductor layers 46, 48, 50, 52 (FIGS. 7, 8, 8A). At least some of the conductor layers 60 may be shared by different instances of the single-photon avalanche diode in the pixel array. Each conductor layer 60 is coupled to the well 14 (FIGS. 7, 8, 8A) and the conductor layers 60 provide contacts to the well 14 at discrete positions that may be shared by the different instances of the single-photon avalanche diode. In alternative embodiments, the size of the pixel array may be expanded to include additional rows and/or columns of single-photon avalanche diodes. The sharing of the conductor layers 60 and the well 14 differs from conventional structures for a pixel array of single-photon avalanche diodes in which each single-photon avalanche diode has a guard ring and non-shared contact to a cathode that are both interior of the deep trench isolation region.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor layer having a device region and a top surface, the device region having a perimeter;

a photodetector including a first well in the device region and a second well, the first well between the second well and the top surface;
a deep trench isolation region that extends from the top surface into the semiconductor layer, the deep trench isolation region surrounding the perimeter of the device region, and the deep trench isolation region comprising a dielectric material; and
a first metal layer in the semiconductor layer, the first metal layer extending from the top surface of the semiconductor layer to the second well, the first metal layer having a first end portion that projects beyond the dielectric material of the deep trench isolation region and into the second well, and the first metal layer having a first discrete position about the perimeter of the device region.

2. The structure of claim 1 wherein the first well adjoins the second well along a p-n junction.

3. The structure of claim 1 wherein the second well includes a first portion that extends beneath the deep trench isolation region and the device region.

4. The structure of claim 3 wherein the second well includes a second portion that is surrounded by the deep trench isolation region, and the second portion of the second well is disposed between the first portion of the second well and the first well.

5. The structure of claim 4 wherein the first metal layer contacts the first portion of the second well.

6. The structure of claim 1 further comprising:
a second metal layer in the semiconductor layer, the second metal layer extending from the top surface of the semiconductor layer to the second well, the second metal layer having a second end portion that projects beyond the dielectric material of the deep trench isolation region and into the second well, and the second metal layer having a second discrete position about the perimeter of the device region.

7. The structure of claim 6 wherein the second well includes a first portion that extends beneath the deep trench isolation region and the device region.

8. The structure of claim 7 wherein the second well includes a second portion that is surrounded by the deep trench isolation region, and the second portion of the second well is disposed between the first portion of the second well and the first well.

9. The structure of claim 8 wherein the first metal layer and the second metal layer each contact the first portion of the second well.

10. The structure of claim 6 wherein the device region has a first corner and a second corner spaced along the perimeter from the first corner, the first metal layer is disposed at the first corner of the device region, and the second metal layer is disposed at the second corner of the device region.

11. The structure of claim 6 wherein the deep trench isolation region includes a first section laterally between the first metal layer and the first well, and the deep trench isolation region includes a second section laterally between the second metal layer and the first well.

12. The structure of claim 11 wherein the deep trench isolation region includes a third section that connects the first section to the second section, the first section is angled relative to the third section, and the second section is angled relative to the third section.

13. The structure of claim 1 wherein the photodetector is a single-photon avalanche detector.

14. The structure of claim 1 wherein the first well has n-type conductivity, and the second well has p-type conductivity.

15. The structure of claim 1 wherein the deep trench isolation region includes a section laterally between the first metal layer and the first well.

16. The structure of claim 1 wherein the semiconductor layer comprises single-crystal silicon.

17. A structure comprising:
a semiconductor layer having a device region and a top surface, the device region having a perimeter;
a photodetector including a first well in the device region and a second well, the first well between the second well and the top surface;
a deep trench isolation region that extends from the top surface into the semiconductor layer, the deep trench isolation region surrounding the perimeter of the device region, and the deep trench isolation region comprising a dielectric material; and
a doped polysilicon layer in the semiconductor layer, the doped polysilicon layer extending from the top surface of the semiconductor layer to the second well, the doped polysilicon layer having an end portion that projects beyond the dielectric material of the deep trench isolation region and into the second well, and the doped polysilicon layer having a discrete position about the perimeter of the device region.

18. The structure of claim 17 wherein the semiconductor layer comprises single-crystal silicon.

19. A method comprising:
forming a photodetector that includes a first well in a device region of a semiconductor layer and a second well, wherein the first well is disposed between the second well and a top surface of the semiconductor layer;
forming a deep trench isolation region that extends from the top surface into the semiconductor layer, wherein the deep trench isolation region surrounds a perimeter of the device region, and the deep trench isolation region comprises a dielectric material; and
forming a metal layer in the semiconductor layer, wherein the first metal layer extends from the top surface of the semiconductor layer to the second well, the metal layer having has an end portion that projects beyond the dielectric material of the deep trench isolation region and into the second well, and the metal layer has a discrete position about the perimeter of the device region.

* * * * *

UNITED STATES PATENT AND TRADEMARK OFFICE
CERTIFICATE OF CORRECTION

| | | |
|---|---|---|
| PATENT NO. | : 12,324,252 B1 | Page 1 of 1 |
| APPLICATION NO. | : 18/649247 | |
| DATED | : June 3, 2025 | |
| INVENTOR(S) | : Francesco Gramuglia and Eng Huat Toh | |

It is certified that error appears in the above-identified patent and that said Letters Patent is hereby corrected as shown below:

In the Claims

Column 10, Claim 19, Line 51 reads:
"the first metal layer extends from the top surface of the"
It should read:
-- the metal layer extends from the top surface of the --

Column 10, Claim 19, Line 53 reads:
"having has an end portion that projects beyond the"
It should read:
-- has an end portion that projects beyond the --

Signed and Sealed this
Eighth Day of July, 2025

Coke Morgan Stewart
*Acting Director of the United States Patent and Trademark Office*